United States Patent
Tran et al.

(10) Patent No.: US 9,312,154 B2
(45) Date of Patent: Apr. 12, 2016

(54) CVD APPARATUS FOR IMPROVED FILM THICKNESS NON-UNIFORMITY AND PARTICLE PERFORMANCE

(75) Inventors: Binh Tran, Houston, TX (US); Anqing Cui, Palo Alto, CA (US); Bernard L. Hwang, Santa Clara, CA (US); Son T. Nguyen, San Jose, CA (US); Anh N. Nguyen, Milpitas, CA (US); Sean M. Seutter, San Jose, CA (US); Xianzhi Tao, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 961 days.

(21) Appl. No.: 12/763,522

(22) Filed: Apr. 20, 2010

(65) Prior Publication Data
US 2010/0294199 A1 Nov. 25, 2010

Related U.S. Application Data

(60) Provisional application No. 61/171,132, filed on Apr. 21, 2009.

(51) Int. Cl.
*H01L 21/67* (2006.01)
*C23C 16/455* (2006.01)
*C23C 16/44* (2006.01)
*H01L 21/687* (2006.01)

(52) U.S. Cl.
CPC ........ *H01L 21/6719* (2013.01); *C23C 16/4401* (2013.01); *C23C 16/4409* (2013.01); *C23C 16/45512* (2013.01); *C23C 16/45561* (2013.01); *H01L 21/68742* (2013.01); *H01L 21/68785* (2013.01)

(58) Field of Classification Search
CPC .................. H01L 21/6719; H01L 21/68785; H01L 21/68742; C23C 16/4409; C23C 16/45512; C23C 16/4401; C23C 16/45561
See application file for complete search history.

(56) References Cited

U.S. PATENT DOCUMENTS

| | | | |
|---|---|---|---|
| 5,525,160 A | | 6/1996 | Tanaka et al. |
| 5,558,717 A | * | 9/1996 | Zhao et al. ................. 118/715 |
| 5,863,397 A | * | 1/1999 | Tu et al. ................. 204/298.12 |
| 5,906,683 A | | 5/1999 | Chen et al. |
| 6,050,446 A | * | 4/2000 | Lei et al. ................. 220/819 |
| 6,056,823 A | * | 5/2000 | Sajoto et al. ........ Y10T 137/876 118/715 |

(Continued)

FOREIGN PATENT DOCUMENTS

| JP | A H09-030893 | 4/1997 |
|---|---|---|
| JP | A 2005-277300 | 6/2005 |
| JP | A 2006-278806 | 12/2006 |

OTHER PUBLICATIONS

International Search Report and Written Opinion mailed Nov. 10, 2010 for PCT Application No. PCT/US2010/031723.

*Primary Examiner* — Jeffrie R Lund
(74) *Attorney, Agent, or Firm* — Moser Taboada; Alan Taboada

(57) ABSTRACT

Embodiments of the invention provide improved apparatus for depositing layers on substrates, such as by chemical vapor deposition (CVD). The inventive apparatus disclosed herein may advantageously facilitate one or more of depositing films having reduced film thickness non-uniformity within a given process chamber, improved particle performance (e.g., reduced particles on films formed in the process chamber), chamber-to-chamber performance matching amongst a plurality of process chambers, and improved process chamber serviceability.

20 Claims, 9 Drawing Sheets

(56) References Cited

U.S. PATENT DOCUMENTS

| | | | |
|---|---|---|---|
| 6,176,198 B1* | 1/2001 | Kao et al. | 118/723 ME |
| 6,454,860 B2* | 9/2002 | Metzner et al. | 118/715 |
| 6,527,865 B1* | 3/2003 | Sajoto et al. | 118/715 |
| 6,616,767 B2* | 9/2003 | Zhao et al. | 219/121.52 |
| 6,776,848 B2* | 8/2004 | Rosenstein et al. | 118/726 |
| 6,972,071 B1* | 12/2005 | Tyler | 156/345.47 |
| 7,101,442 B2 | 9/2006 | Choi et al. | |
| 7,707,965 B2 | 5/2010 | Yamashita | |
| 2002/0069970 A1* | 6/2002 | Noorbakhsh et al. | H01J 2237/2001 156/345.37 |
| 2003/0037880 A1* | 2/2003 | Carducci et al. | H01L 2924/3011 156/345.43 |
| 2005/0109276 A1* | 5/2005 | Iyer et al. | 118/715 |
| 2005/0139160 A1* | 6/2005 | Lei et al. | 118/715 |
| 2005/0217586 A1* | 10/2005 | Lubomirsky et al. | 118/729 |
| 2005/0263072 A1* | 12/2005 | Balasubramanian et al. | 118/715 |
| 2005/0271812 A1* | 12/2005 | Myo et al. | 427/248.1 |
| 2006/0207506 A1* | 9/2006 | Carpenter et al. | 118/715 |
| 2006/0281310 A1* | 12/2006 | Smith et al. | 438/680 |
| 2007/0082507 A1 | 4/2007 | Iyer et al. | |
| 2007/0095285 A1 | 5/2007 | Thakur et al. | |
| 2007/0181057 A1* | 8/2007 | Lam et al. | 117/92 |
| 2008/0202425 A1* | 8/2008 | Gelatos et al. | 118/724 |
| 2008/0286444 A1* | 11/2008 | Floyd et al. | 427/9 |
| 2009/0047446 A1* | 2/2009 | Balasubramanian et al. | 427/569 |
| 2010/0255198 A1* | 10/2010 | Cleary et al. | 427/255.39 |
| 2010/0294199 A1* | 11/2010 | Tran et al. | 118/723 R |

* cited by examiner

CVD APPARATUS FOR IMPROVED FILM THICKNESS NON-UNIFORMITY AND PARTICLE PERFORMANCE

CROSS-REFERENCE TO RELATED APPLICATIONS

This application claims benefit of U.S. provisional patent application Ser. No. 61/171,132, filed Apr. 21, 2009, which is herein incorporated by reference in its entirety.

FIELD

Embodiments of the present invention generally relate to semiconductor substrate processing equipment and techniques.

BACKGROUND

Integrated circuits comprise multiple layers of materials deposited by various techniques, including chemical vapor deposition. As such, the deposition of materials on a semiconductor substrate via chemical vapor deposition, or CVD, is a critical step in the process of producing integrated circuits. Typical CVD chambers may have a heated substrate support for heating a substrate during processing, a gas port for introducing process gases into the chamber, and a pumping port for maintaining the processing pressure within the chamber and to remove excess gases or processing by products. The inventors have observed that, due to the flow pattern of the gases introduced into the process chamber towards the pumping port, it is difficult to maintain a uniform deposition profile on the substrate. In addition, variance in the emissivity of the internal chamber components leads to non-uniform heat distribution profiles within the chamber and, therefore, on the substrate. Also, thermal non-uniformity is also caused by the typical non-symmetric design of the chamber (for example, one side includes a slit valve for entry and removal of a substrate, and the pumping port is typically disposed on an opposite side of the chamber). The inventors have further observed that such non uniformities in the heat distribution profile across the surface of the substrate further leads to non-uniformities in the deposition of materials on the substrate. This, in turn, leads to further costs incurred in planarizing or otherwise repairing the substrate prior to further processing or possible failure of the integrated circuit all together.

As such, the inventors have provided an improved apparatus for uniformly depositing materials on substrates in a CVD chamber.

SUMMARY

Embodiments of the invention provide improved apparatus for depositing layers on substrates, such as by chemical vapor deposition (CVD). The inventive apparatus disclosed herein may advantageously facilitate one or more of depositing films having reduced film thickness non-uniformity within a given process chamber, improved particle performance (e.g., reduced particles on films formed in the process chamber), chamber-to-chamber performance matching amongst a plurality of process chambers, and improved process chamber serviceability.

In some embodiments, an apparatus for processing substrates may include a process chamber having a lower assembly and an upper assembly movable coupled to the upper assembly via a hinge, wherein the lower assembly includes a chamber body having a substrate support assembly disposed in the chamber body, and wherein the upper assembly includes a lid assembly; and a gas feedthrough coupled to the chamber body and the lid to facilitate flow of a gas from a gas panel to an interior of the process chamber, wherein the gas feedthrough comprises an upper body coupled to the lid assembly and a lower body coupled to the chamber body, wherein the upper body includes one or more upper ports and the lower body includes a corresponding one or more lower ports, and wherein the one or more upper ports mate with the corresponding one or more lower ports when the lid is in the closed position.

These and other advantages are described in more detail below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Where possible, identical reference numerals are used herein to designate elements that are common to the figures.

Figure 1:
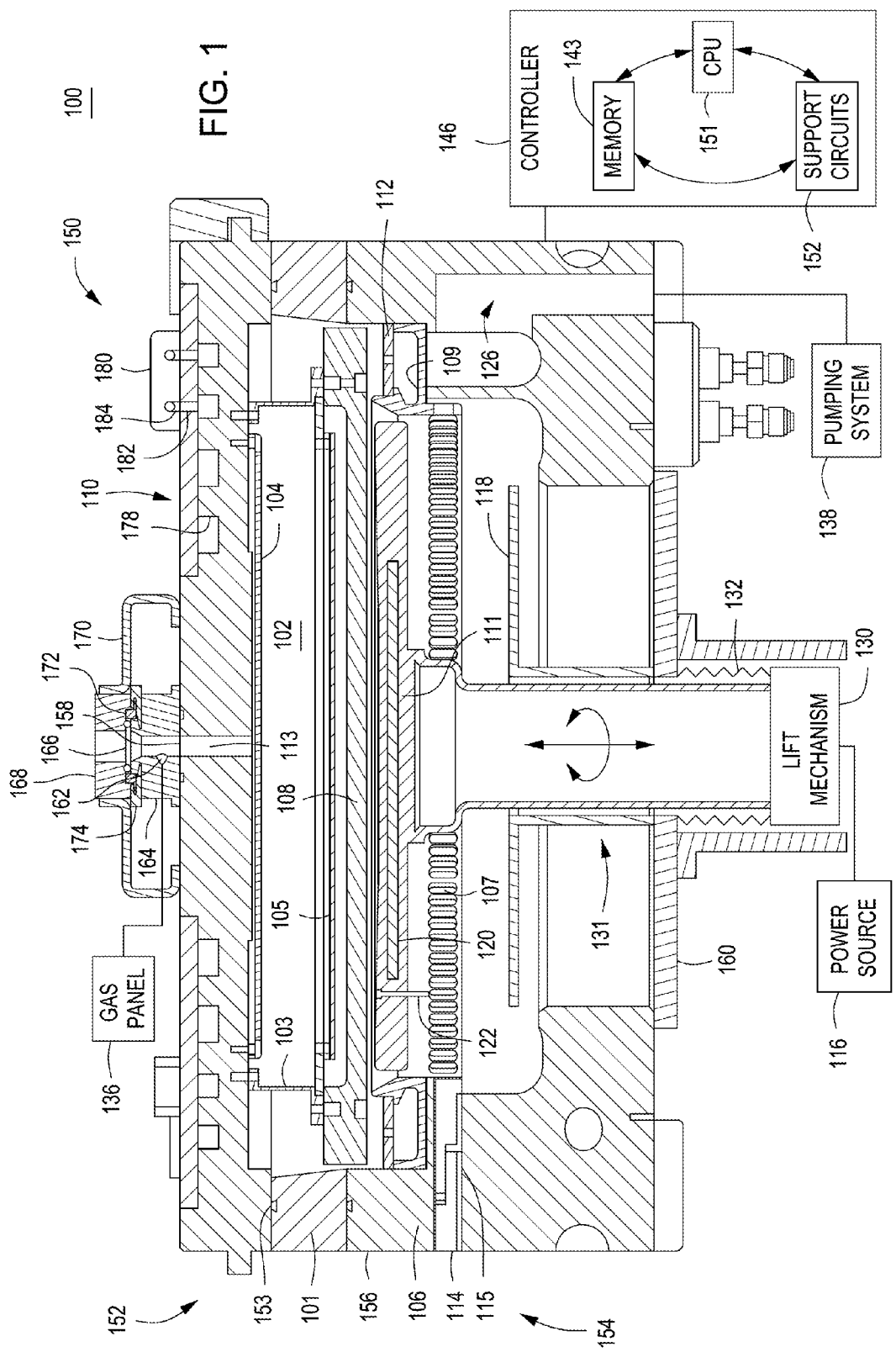
FIG. 1 depicts a simplified cross-sectional view of an exemplary chemical vapor deposition chamber in accordance with some embodiments of the present invention.

The images used in the drawings may be simplified for illustrative purposes and are not necessarily depicted to scale.

DETAILED DESCRIPTION

Embodiments of the invention provide improved apparatus for depositing layers on substrates. Chemical vapor deposition (CVD), sub-atmospheric chemical vapor deposition (SACVD), rapid thermal chemical vapor deposition (RTCVD), and low pressure chemical vapor deposition (LPCVD) are all deposition methods that may be beneficially performed in the inventive apparatus. Examples of CVD processing chambers that may be modified in accordance with the teachings provided herein include the SiNgen®, SiNgen®-Plus, BTBAS, and POLYGEN™ chambers, all of which are commercially available from Applied Materials, Inc. of Santa Clara, Calif.

The inventive apparatus disclosed herein may advantageously facilitate one or more of depositing films having reduced film thickness non-uniformity within a given process chamber, improved particle performance (e.g., reduced particles on films formed in the process chamber), chamber-to-chamber performance matching amongst a plurality of process chambers, and improved process chamber serviceability. These and other advantages are described in more detail below.

FIG. 1 is a cross sectional view of an embodiment of a single wafer CVD reactor 100. In some embodiments, and as depicted in FIG. 1, the reactor 100 may include a processing chamber 150, a power source 116, a gas panel 136, a pumping system 138, and a controller 146.

The processing chamber 150 generally includes a bottom assembly 154, an upper assembly 152, and a pedestal lift assembly 131. The processing chamber 150 may contain additional apparatus further described below, such as a reflector plate, or other mechanism tailored to facilitate heat transfer, probes to measure chamber conditions, an exhaust assembly, and other equipment to support the substrate and to control the chamber environment.

The bottom assembly 154 comprises a chamber body 156 having a wall 106 partially defining an interior of the processing chamber 150. The wall 106 may be substantially cylindrical and closed at the upper end by the lid 110. Sections of the wall 106 may be thermally regulated. For example, in some embodiments, a plurality of conduits (not shown) may be disposed in the wall 106 and configured to circulate a heat transfer fluid to regulate the temperature of the wall.

A substrate support assembly 111 is disposed in the bottom assembly 154 for supporting a substrate (not shown) during processing. The substrate support assembly 111 may include a heater 120 configured to regulate the temperature of the substrate and/or temperature in the internal volume of the processing chamber 150. The heater 120 is coupled to the power source 116 and, in some embodiments, may be capable of maintaining the substrate at a temperature of up to about 800° C.

Figure 12:
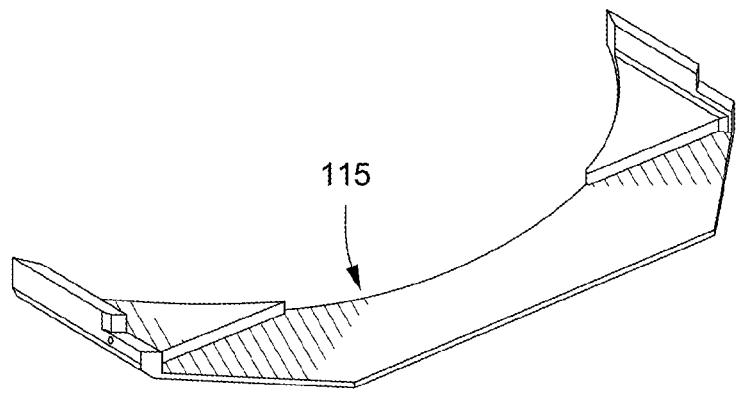
FIG. 12 depicts a perspective view of a slit valve liner in accordance with some embodiments of the present invention.

A slit valve opening 114 may be positioned in the wall 106 of the chamber body 156 to facilitate entry and egress of substrates into and out of the processing chamber 150. In some embodiments, a slit valve liner 115 may be used to reduce heat loss through the slit valve opening 114. For example, FIG. 12 depicts a three-dimensional view of the slit valve liner 115 of FIG. 1 in accordance with some embodiments of the present invention. The slit valve liner 115 may reduce heat loss through the slit valve opening 114 by directing process gas flow and reducing heat transfer through the slit valve.

Returning to FIG. 1, the upper assembly 152 generally comprises a lid 110 and may further include gas feed inlets, a gas mixer, a remote plasma source, and one or more gas distribution plates, as described below. The lid 110 may be movably coupled, by a hinge or other suitable mechanism, to the lower assembly 154.

Figure 6:
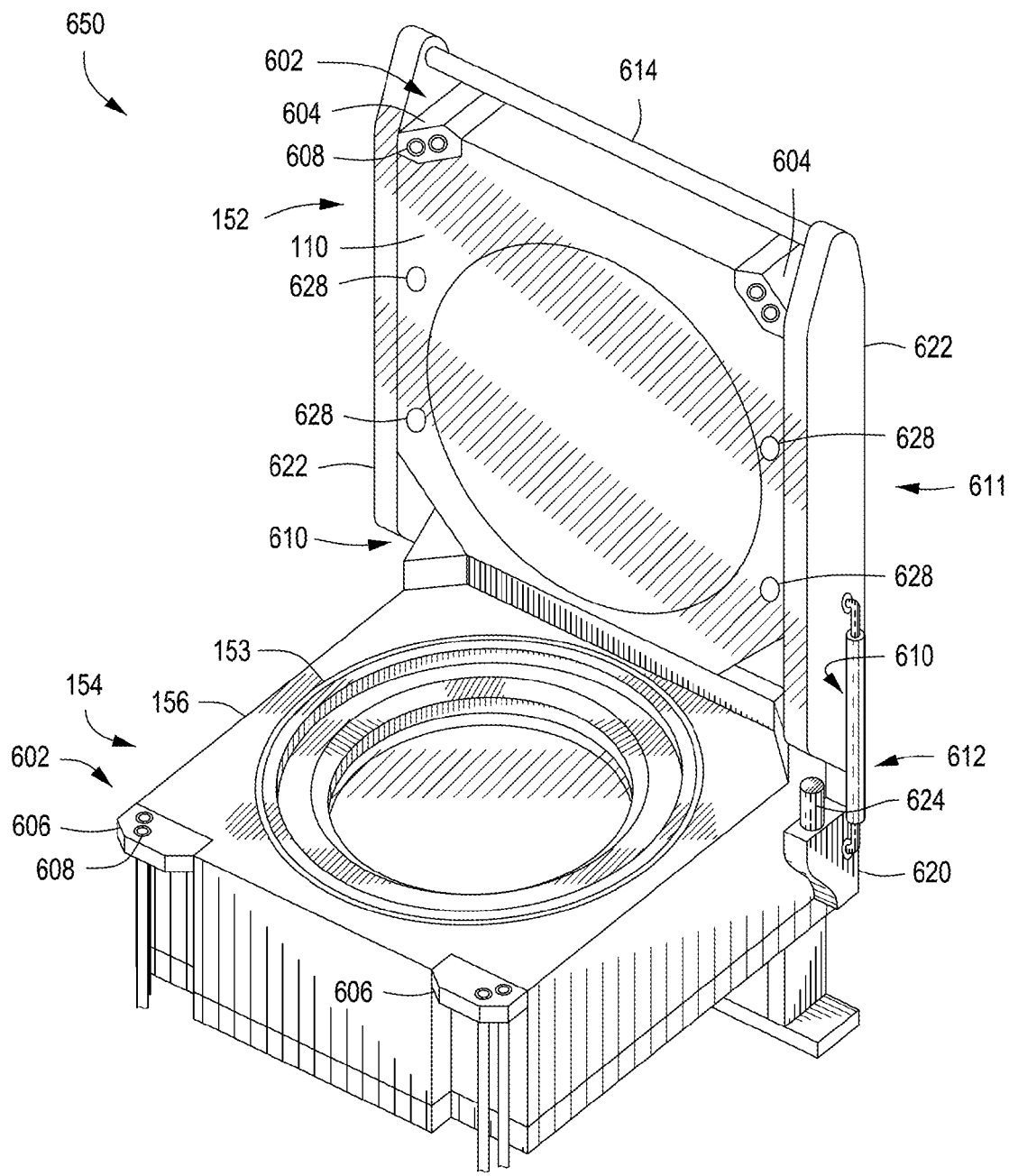
FIG. 6 depicts a schematic perspective view of a chemical vapor deposition chamber having an open lid, in accordance with some embodiments of the present invention.
Figure 6A:
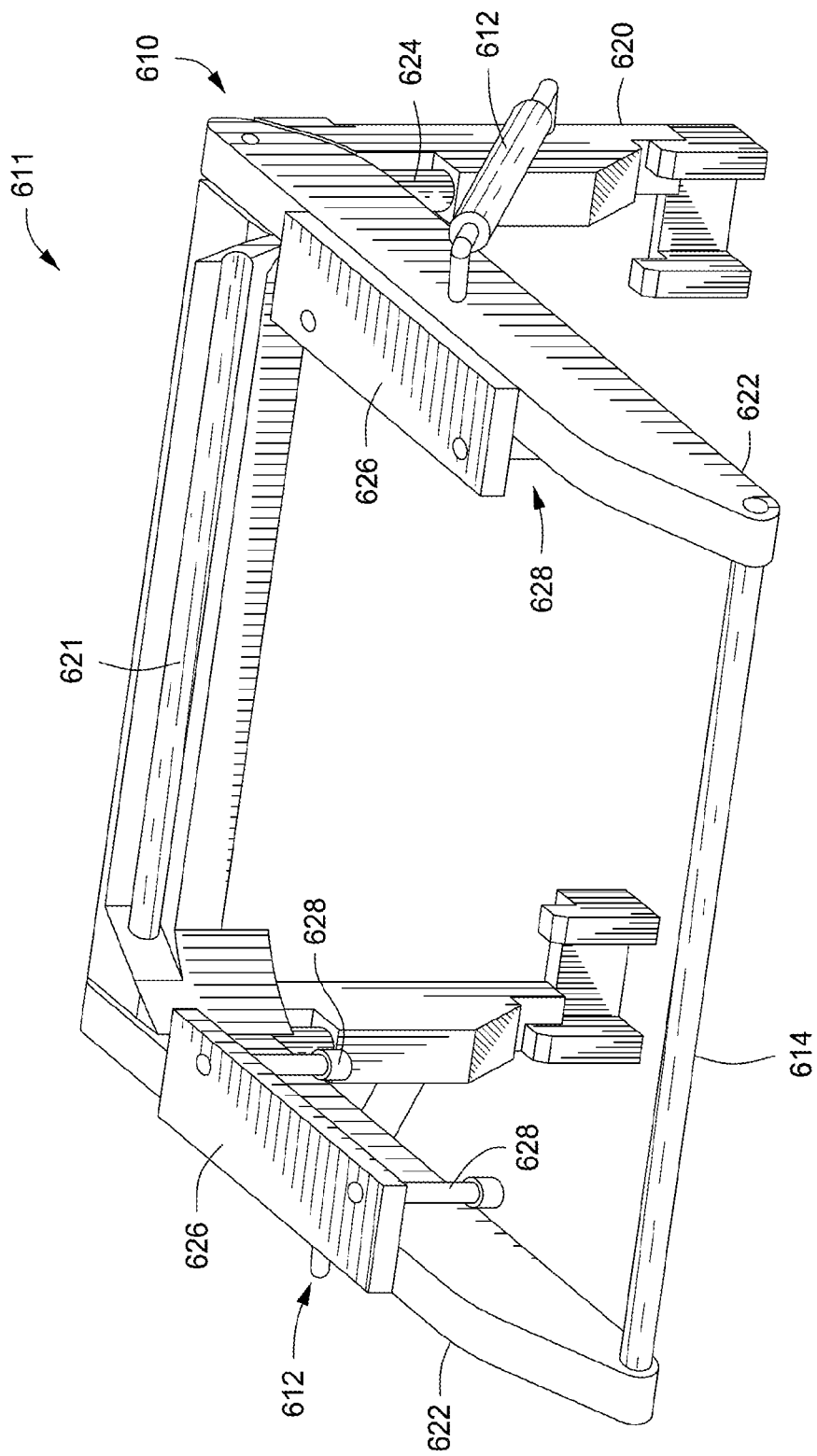
FIG. 6A depicts a schematic perspective view of a lid support and hinge assembly in accordance with some embodiments of the present invention.

For example, FIG. 6 depicts a simplified perspective view of a processing chamber 650 in accordance with some embodiments of the present invention. The process chamber 650 has features similar to the process chamber 150 described in FIG. 1. In some embodiments and as depicted in FIG. 6, the lid 110 may be coupled to the chamber body 156 of the lower assembly 154 by a lid support and hinge assembly 611 (also shown in FIG. 6A). The assembly 611 includes a hinge 610 comprising a pair of lower arms 620 coupled to a respective pair of upper arms 622 via a hinge rod 621. The lower arms 620 may be coupled to the bottom assembly 154 of the chamber body 156. The upper arms 622 may be coupled to the upper assembly 152 of the chamber body 156 and may include one or more lids support plates 626 for securing the lid thereto (for example using bolts).

A handle 614 may be provided to facilitate opening and closing the lid 110. To facilitate ease of opening and closing the lid 110, which may be heavy, and to prevent damage to the lid 110, the chamber body 156, and/or to an operator, a mechanism, such as a gas-filled piston 612, may be provided on one or both sides of the hinge 610 and coupled to the lid 110 and the chamber body 156 to support the bulk of the weight of the lid 610 and to prevent the lid 610 from closing too quickly. In some embodiments, a shock absorber 624 may be provided to provide further cushioning when closing the lid 110.

In some embodiments, the lid support and hinge assembly 611 may be configured to allow the lid 110 to float, thereby facilitating better alignment of the lid 110 with the chamber body 156, and providing a better seal therebetween (for example, by facilitating providing more even pressure to a seal or gasket disposed therebetween, such as o-ring 153 shown in FIGS. 1 and 6). Such improved seating of the lid 110 on the chamber body 156 advantageously reduces the risk of leaks. In some embodiments, a plurality of lid support pins 628 may extend perpendicularly from the lid support plates 626 to act as a linear bearing upon which the lid 110 may move to facilitate allowing the lid 110 to float.

In some embodiments, the hinge 610 may be disposed on a side of the chamber body 156 adjacent a transfer chamber (not shown), for example of a cluster tool, to which the CVD reactor 100 is attached (e.g., the hinge 610 may be disposed on a side of the chamber body 156 containing the slit valve opening 114). Such a configuration advantageously improves access to the chamber, for example, for servicing the chamber. For example, in such a configuration, the lid 110 of the CVD reactor 100 may be opened from a side opposing the cluster tool where more room to maneuver is available.

Returning to FIG. 1, the lid 110 may further include one or more grooves or channels 178 for flowing a heat transfer fluid therethrough (such as water) to help maintain the lid 110 at a desired temperature. In some embodiments a manifold 180 may be provided to route the heat transfer fluid to/from the channels 178. In some embodiments, the manifold 180 may be one piece and may be welded to the lid 110 to minimize any leakage of the heat transfer fluid. The manifold 180 includes or more passages 184 disposed therethrough and in alignment with one or more corresponding passages 182 formed in the lid 110 in fluid communication with the one or more of the channels 178.

The gas panel 136 provides process chemicals, in liquid and/or gaseous form, to the processing chamber 150. The gas panel 136 is coupled to the lid 110 using a plurality of gas lines. Each gas line may be selectively adapted for transferring specific chemical(s) from the gas panel 136 to the inlet port 158, as well as be temperature controlled. In some embodiments, one or more gas feed inlets 162 may be provided in a lid manifold 164 coupled to an upper surface of the lid 110 to facilitate delivery of the process chemicals to the process chamber 150. In some embodiments a plurality of gas feed inlets 162 may be provided for delivering a plurality of feed gases to the processing chamber 150. The feed gases may be provided from respective gas sources (such as the gas panel 136) through one or more gas feedthroughs (not shown in FIG. 1) coupled to the gas feed inlets 162.

In some conventional chambers, gas feedthroughs may be provided in part within the body 156 and in part within the lid 110, thereby requiring precise alignment avoid leakage, contamination, and/or inaccurate gas flows. However, in some embodiments of the present invention, one or more gas feedthroughs may be provided external to the body and the lid.

Figure 7:
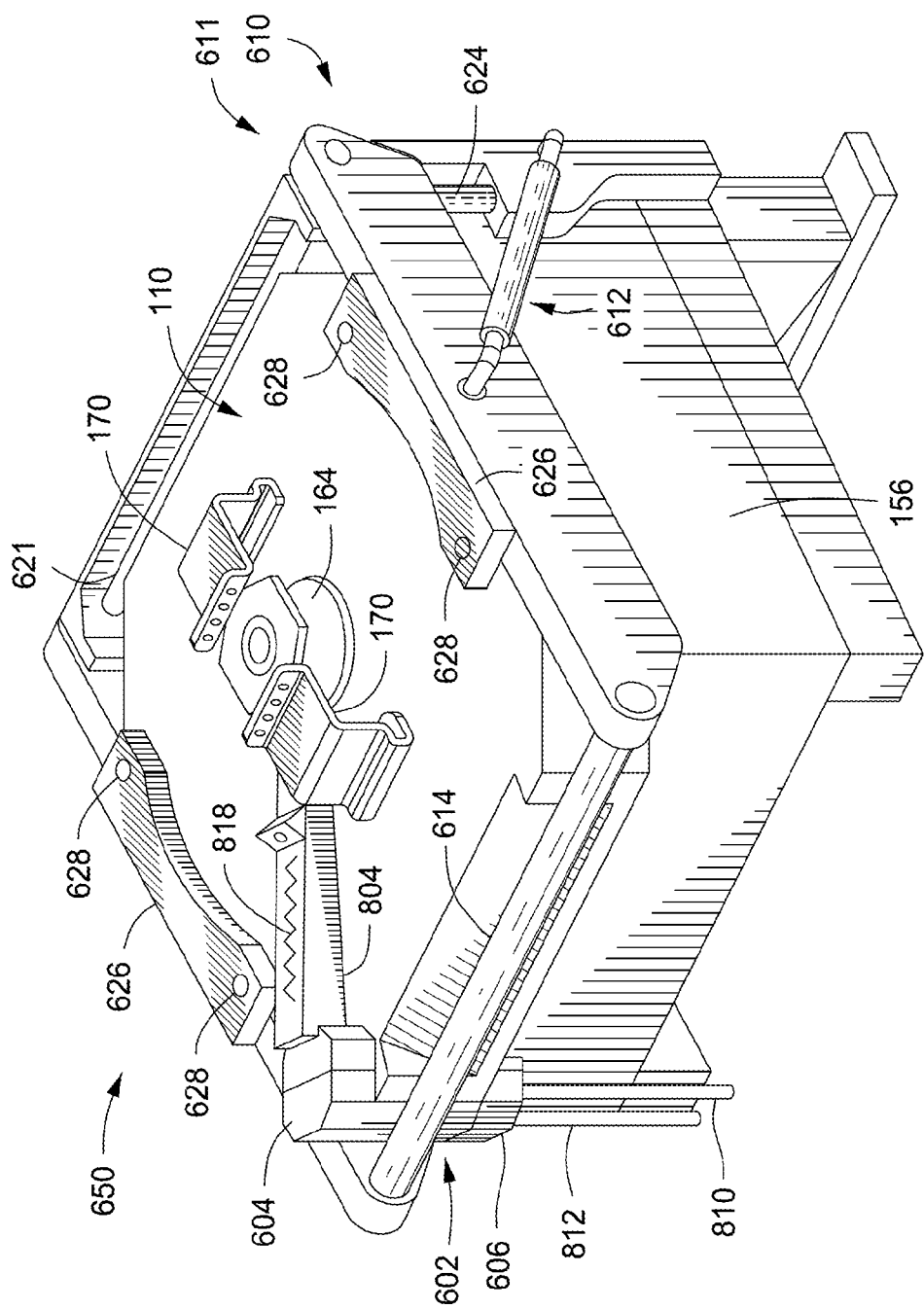
FIG. 7 depicts a schematic perspective view of the chemical vapor deposition chamber of FIG. 6 having a closed lid, in accordance with some embodiments of the present invention.

For example, FIG. 6 depicts a simplified perspective view of a processing chamber 650, with the lid in an open position, in accordance with some embodiments of the present invention (FIG. 7 depicts the processing chamber 650 with the lid in a closed position). The process chamber 650 has features similar to the process chamber 150 described in FIG. 1. In some embodiments, the process chamber 650 includes gas feedthroughs 602 that are external, or adjustable with respect to, to the body 156 and the lid 110. Each gas feedthrough 602 includes an upper body 604 having one or more ports 608 and a lower body 606 having a corresponding one or more ports 608 that mate when the lid 110 is in a closed position. A seal (such as a gasket or o-ring (not shown) may be provided between the upper and lower bodies 604, 606 to facilitate prevention of feed gas leakage. In some embodiments at least one of the upper and lower bodies 604, 606 in each corresponding pair may be adjustable to facilitate fine-tuning the coupling therebetween when the lid 110 is in the closed position, thereby allowing for compensation in variance in o-ring or seal dimensions, lid alignment variance between cycles, or the like. Moreover, the peripheral location of the gas feedthroughs 602 facilitates ease of checking for leaks, as compared to feedthroughs disposed in a more inward location of the chamber body.

In some conventional designs, process gases coupled from the gas feedthroughs to the lid manifold may be routed through independent channels having o-rings at each end to prevent leaks through the respective channels. However, such a design increases the potential failure points by providing more joints as well as leaves some o-rings proximate a plasma flow stream from the remote plasma source (when in operation) that may lead to premature wear and/or damage to those o-rings.

Figure 8:
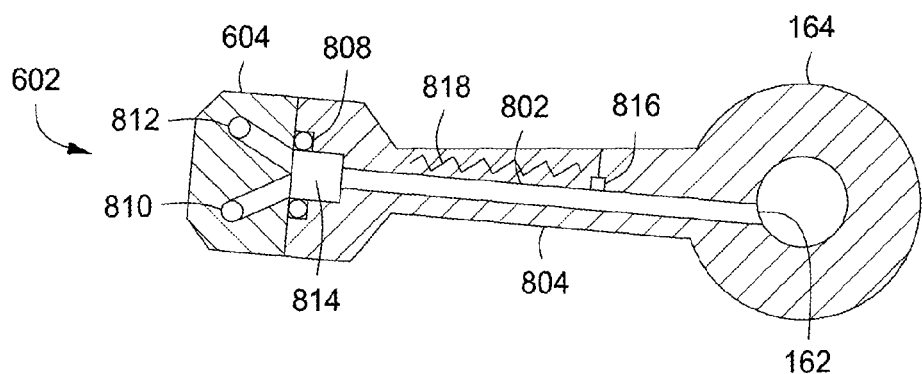
FIG. 8 depicts a top, cross-sectional view of portions of a gas delivery system in accordance with some embodiments of the present invention.

In some embodiments of the present invention, and as shown in FIG. 8, multiple gases provided to the gas feedthroughs 602 may be routed through a single conduit 802 to the lid manifold 164 (e.g., multiple gas inlets 810, 812 may be coupled to the conduit 802). The conduit 802 may enhance mixing of process gases flowing therethrough by diffusion. In some embodiments, a removable mixer 814 may be provided to enhance mixing of process gases. In some embodiments, the conduit 802 may terminate non-perpendicularly at the lid manifold 164, such that gases entering the lid manifold through the gas feed inlet 162 tends to form a vortex. In some embodiments, the conduit 802 may be formed in an arm 804 extending from the lid manifold 164 and integrally formed therewith (thereby avoiding the need for an o-ring proximate the lid manifold 164 for the process gases routed through the conduit 802).

In some embodiments, a heater 818 may be provided to heat the gases flowing through the conduit 802. The heater may be any suitable heater, such as a resistive heater, and may be coupled to an exterior surface of the arm 804, inserted in an opening in the arm 804 (not shown), or disposed within the arm 804. In some embodiments, a sensor 816 may be provided to provide data corresponding to a temperature of gases flowing through the conduit 802. In some embodiments, the sensor 816 may be a thermocouple. In some embodiments, the arm 804 may be spaced apart from the lid 110 to minimize thermal transfer of heat from the arm 804 to the lid 110.

The upper body 604 of the gas feedthrough 602 may be coupled to the arm 804 in any suitable manner, such as bolts, or the like (not shown), and may include an o-ring 808 disposed therebetween to facilitate reduction or elimination in gas leakage through the joint. By avoiding the need for an o-ring proximate the lid manifold 164 (and proximate the plasma stream from the remote plasma source), the present design eliminates the risk of damage to such o-rings, which could otherwise lead to particles entering the gas stream and/or leakage of gases out of the chamber. Moreover, by reducing the number of o-rings in the gas delivery system, the present invention further reduces the risk of leakage or particles due to o-ring failure.

Figure 8A:
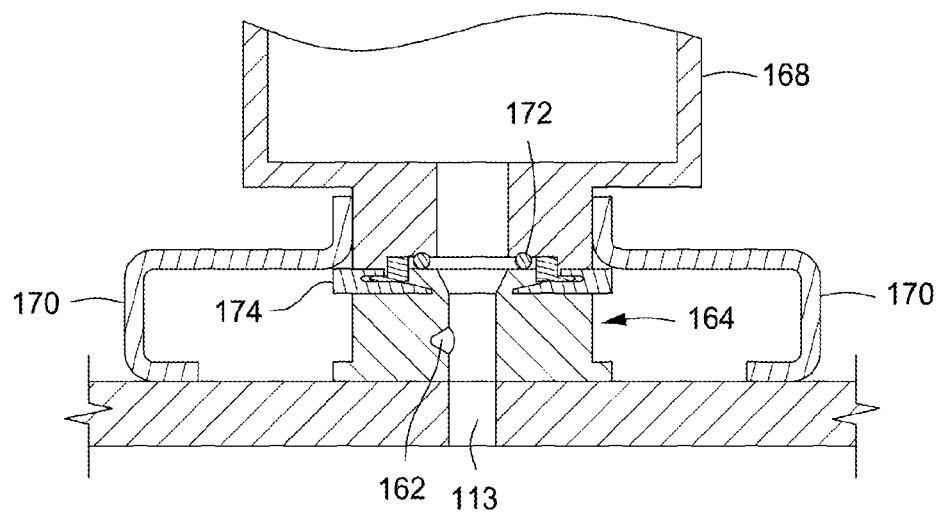
FIG. 8A depicts a cross-sectional view of portions of a gas delivery system in accordance with some embodiments of the present invention.

Referring to FIG. 1 and to FIG. 8A, which depicts the lid manifold and remote plasma source assembly in greater detail, the lid manifold 164 may further include an opening 166 for coupling to a remote plasma source (only outlet 168 of remote plasma source shown). A support bracket 170 may be provided to secure the remote plasma source to the lid 110. A clamp 174 may be provided to secure the remote plasma source to the lid manifold 164. In some embodiments, the clamp 174 may be a KF style clamp. The outlet 168 may have a contact surface to press against the upper surface of the lid manifold 164. A gasket, such as o-ring 172 may be provided between the outlet 168 of the remote plasma source and the lid manifold 164 to prevent leakage therebetween. The application of direct clamping force by the clamp 174 to the o-ring 172 facilitates generating and maintaining a good seal to reduce the likelihood of leakage.

Returning to FIG. 1, the lid manifold 164 generally provides process materials (e.g., from the gas inlets 162 and/or remote plasma source) to the process chamber through the lid 110. In some embodiments, the lid 110 may include an inlet port 158 and a mixer 113. In some embodiments, the mixer 113 leads to a showerhead for providing process materials to the interior of the processing chamber 150. The showerhead provides, through a plurality of openings, distribution of gases or vapors delivered from the gas panel 136. Size, geometry, number, and location of the openings may be selectively chosen to facilitate a predefined pattern of gas/vapor flow to a substrate disposed within the processing chamber 150.

For example, during processing, feed gas may enter the processing chamber 150 through a gas delivery system (e.g., gas panel 136 and associated apparatus) before passing through the inlet port 158 to a mixer 113 in the lid 110 and holes (not shown) in a first blocker plate 104. The feed gas then travels through a mixing region 102 created between the first blocker plate 104 and a second blocker plate 105. The second blocker plate 105 is structurally supported by an faceplate extension 103. After the feed gas passes through holes (not shown) in the second blocker plate 105, the feed gas flows through holes (not shown) in a faceplate 108 and enters the main processing region defined by the chamber wall 106, the faceplate 108, and the substrate support assembly 111. Optionally, the processing chamber 150 may include an insert 101 disposed between an upper surface of the chamber wall 106 and the lid 110 that is heated to provide heat to the faceplate extension 103 to heat the mixing region 102.

Figure 2:
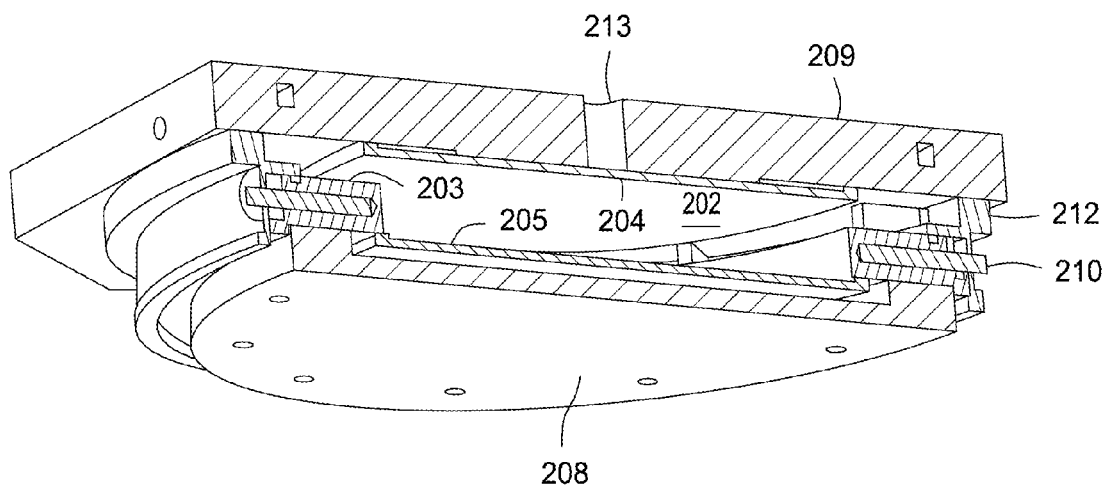
FIG. 2 depicts a perspective schematic view of a process kit for a single wafer thermal CVD process chamber in accordance with some embodiments of the present invention.

In some embodiments, the lid 110 may be separated from the rest of the chamber by thermal insulating break elements. For example, FIG. 2 depicts an expanded view of a lid assembly in accordance with some embodiments of the invention and suitable for use in a CVD chamber as described in any of the embodiments disclosed herein. The lid 209 may be separated from the rest of the chamber by thermal insulating break elements 212. The break elements 212 may be disposed on the upper and lower surface of a heater jacket 203. The heater jacket 203 may also be connected to a blocker plate 205 and a faceplate 208. Optionally, parts of the lid or lid components may be heated.

The lid assembly includes an initial gas inlet 213 to premix the feed gas before entering a space 202 defined by the lid 209, the thermal break elements 212, the heater jacket 203, and the blocker plates 204 and 205. The space 202 provides increased residence time for the reactant gases to mix before entering the substrate processing portion of the chamber. Heat may be applied by a heater 210 to the surfaces that define the space 202 to help prevent the buildup of raw materials along the surfaces of the space. The heated surfaces also preheat the reactant gases to facilitate better heat and mass transfer once the gases exit the faceplate 208 and enter the substrate processing portion of the chamber.

Figure 3:
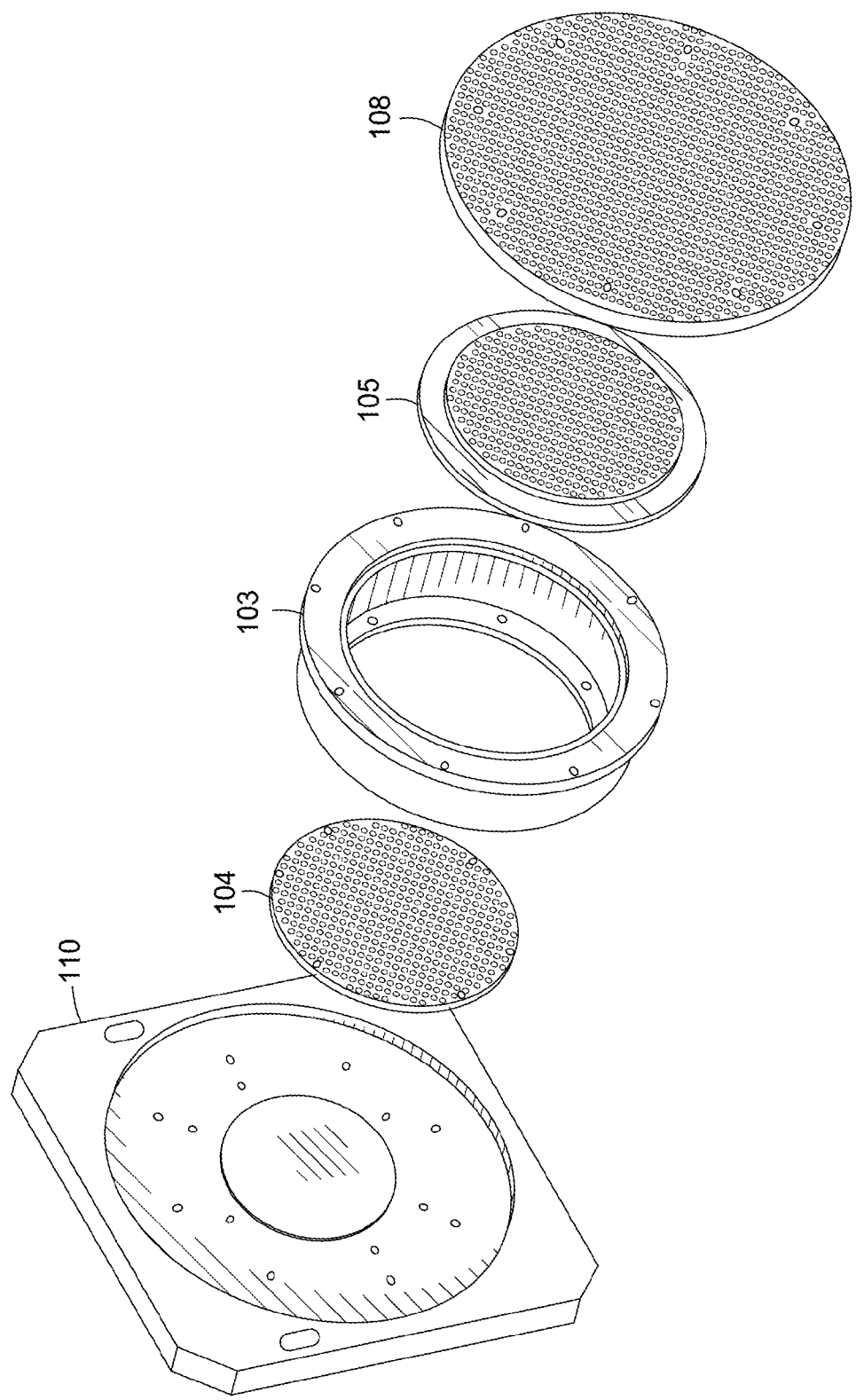
FIG. 3 depicts an exploded view of the portions of the gas feed system shown in FIG. 1 in accordance with some embodiments of the present invention.

FIG. 3 is an exploded view of the portions of the gas feed system shown in FIG. 1 in accordance with some embodiments of the present invention. FIG. 3 illustrates how the lid 110, one or more blocker plates 104,105, the faceplate extension 103, and the faceplate 108 may be configured to provide a space with heated surfaces for heating and mixing the gases before they enter the processing region of the chamber.

Figure 9:
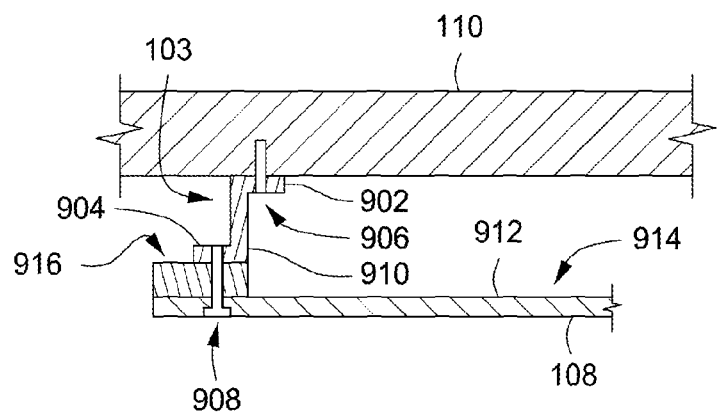
FIG. 9 depicts one configuration of a faceplate extension in accordance with some embodiments of the present invention.

In some embodiments, the faceplate extension 103 may be configured to provide ease of installation. FIG. 9 depicts one illustrative configuration of the faceplate extension 103 in accordance with some embodiments of the present invention. As shown in FIG. 9, the faceplate extension 103 may include a first flange 902 and a second flange 904 on opposite sides of a body 910. The first flange 902 and the second flange may extend in opposite directions from the body 910. For example, in the embodiment depicted in FIG. 9, the first flange 902 extends radially inwards and the second flange extends radially outwards. A hole 906 be provided in the first flange 902 for bolting the faceplate extension 103 to the lid 110 (or other component coupled to the lid). A hole 908 may be provided through the faceplate 108 and the second flange 904 for bolting the faceplate extension 103 to the faceplate 108. As the flanges 902, 904 extend in opposite directions, there is easy and direct access to the bolts coupling the faceplate extension 103 to the lid 110, thereby facilitating ease of installation and removal of the extension.

Figure 4:
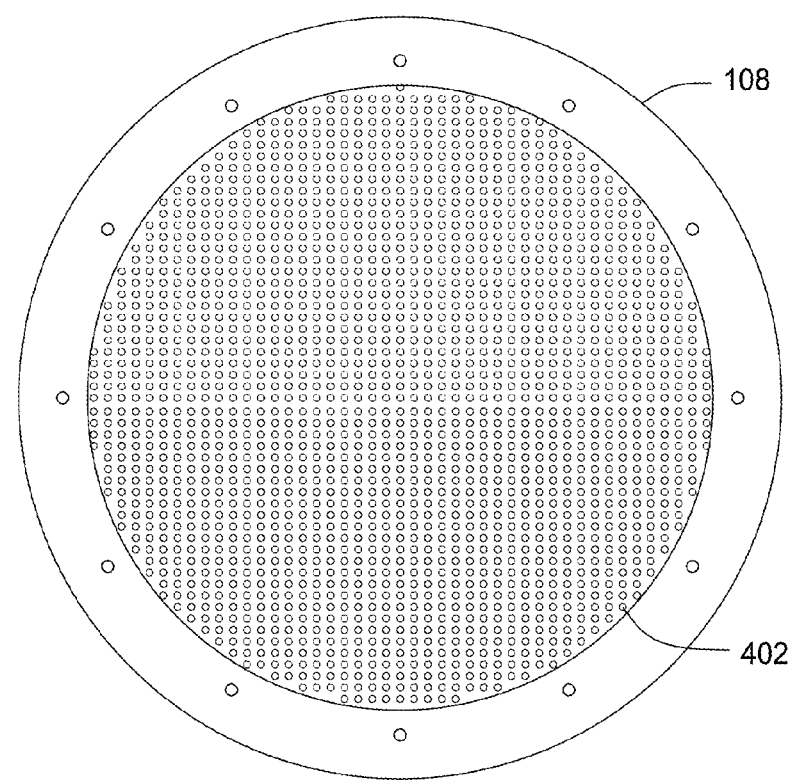
FIG. 4 depicts a top view of a faceplate in accordance with some embodiments of the present invention.

FIG. 4 is an illustration of the faceplate 108 of FIG. 1 in accordance with some embodiments of the invention. The faceplate 108 is supported by the faceplate extension 103. The faceplate 108 is connected to the faceplate extension 103 by screws and is configured with holes 402 arranged to create a desirable gas inlet distribution within the processing region of the chamber.

In some embodiments, and as depicted in FIG. 9, the faceplate 108 may include an anodized surface 912. The anodized surface facilitates raising the temperature of the faceplate 108 during processing. In some embodiments, the raised temperature of the anodized faceplate 108 may cause the faceplate 108 to stick, or get fused, to the faceplate extension 103. Accordingly, in some embodiments, the surface 912 of the faceplate 108 may be selectively anodized. Specifically, the surface 912 of the faceplate 108 may have an inner portion 914 that is anodized, and an outer portion 916 that is not anodized. The outer portion 916 may correspond to the region where the faceplate extension 103 is coupled to the faceplate 108, thereby reducing or eliminating the fusing problem.

Returning to FIG. 1, the pedestal lift assembly 131 is coupled to a base 160 of the processing chamber 150 and is further coupled to the substrate support assembly 111. The pedestal lift assembly 131 comprises a lift mechanism 130, a lift plate 118 and a set of lift pins 122. In operation, the pedestal lift assembly 131 controls the elevation of the pedestal 124 between a processing position (as shown in FIG. 1) and a lowered position from which the substrate may transported, through the slit valve opening 114, into and out of the processing chamber 150. The substrate support assembly 111 is coupled to the chamber body 156 using a flexible bellows 132 to maintain an airtight seal between the interior and exterior of the processing chamber 150.

In some embodiments, the pedestal lift assembly 131 may be configured to rotate the substrate support assembly 111. The rotational movement of the pedestal lift assembly 131 enables smoothing, or making more uniform, any uneven temperature distribution on the substrate during processing and may provide numerous other processing advantages. Details of such other processing advantages may be found in U.S. patent application Ser. No. 11/147,938, filed Jun. 8, 2005 by Jacob Smith, et al., and entitled, "Rotating Substrate Support and Methods of Use," which is herein incorporated by reference in its entirety.

Figure 5:
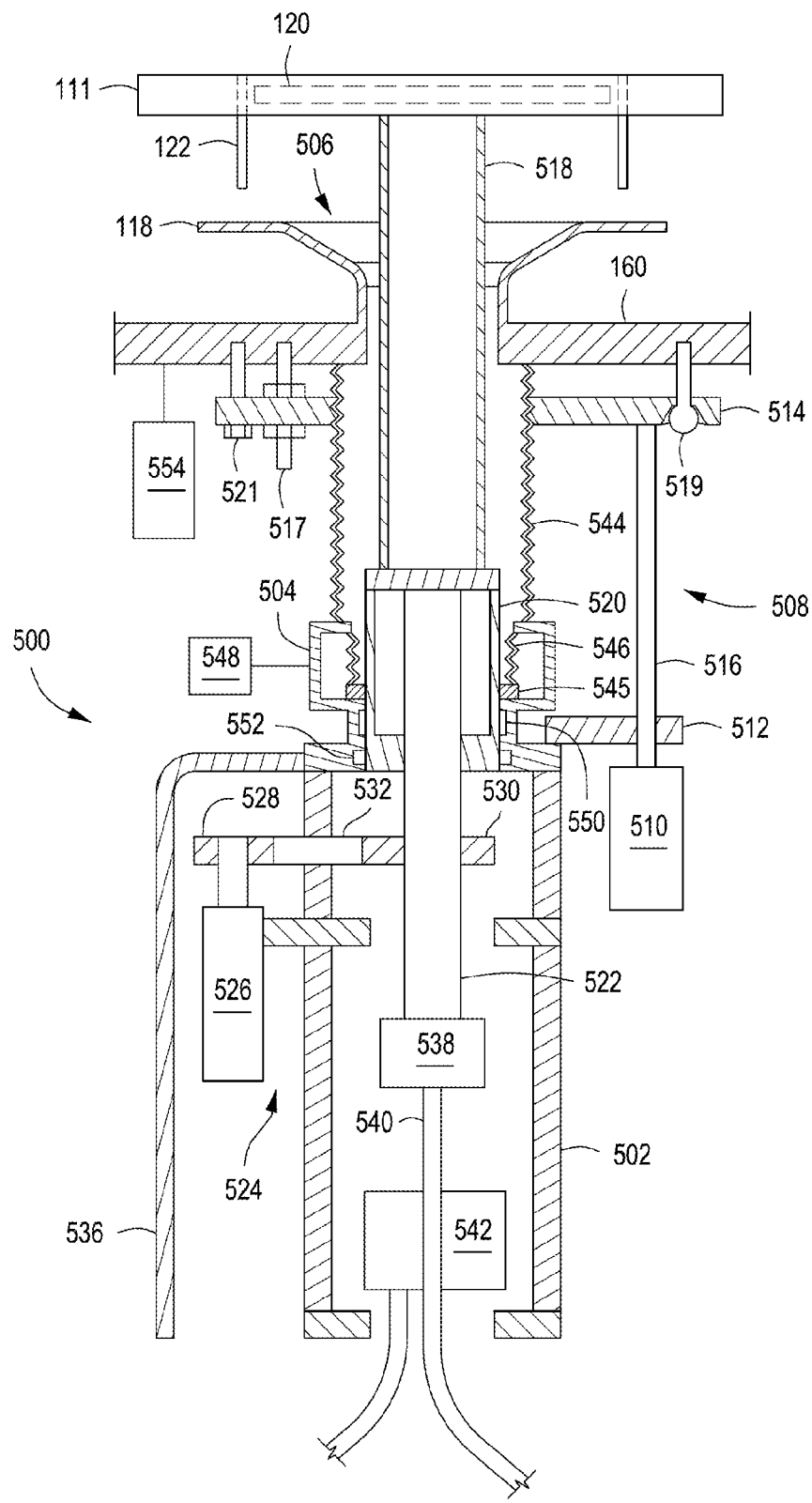
FIG. 5 depicts a schematic cross sectional view of the rotating substrate support depicted in FIG. 1.

For example, FIG. 5 depicts a cross sectional simplified view of some embodiments of a rotating lift assembly 500 (similar to the pedestal lift assembly 131 of FIG. 1 to the extent not disclosed to the contrary, below). In some embodiments, the rotating lift assembly 500 includes a frame 502 coupled to an x-y adjustment mechanism 504 disposed beneath a base 160 of the processing chamber 150. The frame 502 supports the substrate support assembly 111 via a shaft 506, which extends through an opening in the base 160 of the processing chamber 150.

A lift mechanism 508 is coupled to the frame 502 and off axis from the shaft 506. The lift mechanism 508 moves the frame 502 along a central axis generally perpendicular to the base 160 of the process chamber 150, thereby providing a range of motion to raise and lower the substrate support assembly 111 within the processing chamber 150. The lift mechanism 508 may include a stepper motor 510 coupled directly to the frame (not shown) or coupled to the x-y mechanism 504 via a base plate 512 as shown. The stepper motor 510 or other suitable mechanism can provide the desired range of motion to the substrate support assembly 111. The lift mechanism 508 may further include a leveling plate 514 coupled to the stepper motor 510 via shaft a 516. The leveling plate 514 may be coupled to, and leveled with respect to, the base 160 via one or more level adjusting studs 517, ball and socket joints 519, and set screws 521. For example, when mounting the rotary lift assembly 550 to the base 160, the leveling plate may be initially coupled at one end to the ball and socket joint 519. Typically, the ball portion of the ball and socket joint 519 is coupled to the base 160, and the socket portion is disposed in the leveling plate 514 as shown. The level adjusting stud 517 may be then couple an opposing end of the leveling plate 514 to the base 160. The level adjusting stud 517 may include a threaded rod having two bolts, wherein each bolt is disposed on an opposing face of the leveling plate 514 as shown in FIG. 5. The level of the leveling plate 514 may be adjusted relative to the ball and socket 519 by changing the bolt positions along the threaded rod of the level adjusting stud 517. Upon leveling of the leveling plate 514 by adjusting the bolts, the opposing end of the leveling plate 514 may be secured using the set screw 521.

The shaft 516 may be a ball screw or another similar device, and having a threaded portion that interfaces with the base plate 512. In operation, the stepper motor 510 spins the shaft 516 about a central axis in either a clockwise or counterclockwise direction. The threaded portion of the shaft 516 causes the base plate 512 to provide a force against the frame 502 which may result in up or down movement of the substrate support assembly 111.

The shaft 506 may include an upper shaft 518, a lower shaft 520, and a conduit 522. The upper shaft 518 may be directly coupled to the substrate support assembly 111 as illustrated in FIG. 5. The upper shaft 518 may be hollow, thereby having a means to provide service lines such as electrical, water, and/or gas lines therethrough and to the support assembly 111. For example, electrical lines may include lines supplying power to either or both of the heater 120 and a thermocouple (not shown). The lower shaft 520, similar to the upper shaft 518, may be hollow for running service lines therethrough. The lower shaft 518 may be generally surround by the x-y mechanism 504, wherein the x-y mechanism provides a force against the lower shaft 518 to move the support assembly 111 in a plane parallel to a surface of a substrate disposed thereon. The conduit 522 may be partially disposed in, and coupled to, the hollow portion of lower shaft 518 and extending along the length of the lower shaft 518. The conduit 522 may be a hollow metal tube or similar structure for providing electrical lines to the upper and lower shaft.

As depicted in FIG. 5, the conduit 522 is generally disposed along the central axis of the shaft 506 and within the frame 502. The conduit 522 may be coupled to a rotary mechanism 524, where the rotary mechanism 524 may be utilized to rotate the substrate support assembly 111 about a central axis. The rotary mechanism 524 includes a rotary motor 526 coupled to the frame 502 and disposed off the central axis of the shaft 506. The rotary mechanism 524 further includes a pulley system having a first pulley 528 and a second pulley 530 coupled via a belt 532. The first pulley 528 is coupled to the rotary motor 526 and the second pulley is coupled to the conduit 522. When the rotary motor 526 is engaged the first pulley 528 rotates about an axis parallel to the central axis of the shaft 506. The rotary motion provided by the first pulley 528 is translated to the second pulley 530 via the belt 532, thereby resulting in a translation of the rotary motion to the conduit 522 and hence the support assembly 111. The rotary mechanism 524 may be covered by a safety shield 536 coupled to the frame 502.

The rotary motor 526 typically operates in the range of between about 0 to about 60 rotations per minute (rpm) and has a steady state rotational speed variability of about 1 percent. In some embodiments, the motor 526 may rotate in the range of between about 1 and about 15 rpm. In some embodiments, the motor 526 may rotate in the range of between about 2.5 and about 7.5 rpm. The motor 526 may have accurate rotational control and be index capable to within about 1 degree. Such rotational control allows for alignment of a feature, for example, a flat portion of the substrate or a notch formed on the substrate, used to orient the substrate during processing. Additionally, such rotational control allows for the knowledge of the position of any point on a substrate relative to the fixed coordinates of the interior of the processing chamber 150.

Optionally, a sensor (not shown), such as an optical sensor, may be provided to prevent rotation of the substrate support assembly 111 when the lift pins 122 are engaged by the lift plate 118 (as discussed with respect to FIG. 1). For example, the optical sensor may be disposed on the outside of the rotating lift assembly 550 and configured to detect when the assembly is at a predetermined height (e.g., a raised processing position or a lowered substrate transfer position).

The conduit 522 may further include an electrical union 538 disposed at the base of the conduit 522. The electrical union 538 may couple the electrical lines 540 entering the conduit 540 to those electrical lines (not shown) disposed in the conduit 522 for providing power to the support assembly 111. The electrical lines may have a water union 542 disposed about a portion thereof, for example, at the base of the frame 502 as shown in FIG. 5. The water union 542 may be disposed about the electrical lines 540, for example, to maintain a compact footprint of the rotating lift assembly 500. However, the water union 542 need not be disposed about the electrical lines 540, and may be disposed separate therefrom. The water union 542 may further include one or more water lines (not shown) coupled thereto for providing water to the support assembly 111 via the shaft 506. For example, the water lines may be provided as a means of controlling the temperature a substrate disposed on the support assembly 111. For example, the water line may be part of a heat exchanger or another similar apparatus.

In order to maintain the pressure differential between the process volume inside the processing chamber 150 and the atmosphere outside the processing chamber 150, the x-y mechanism 504 surrounds the lower shaft 520 and forms a seal therewith. Additionally, a bellows 544 is coupled between the base 160 and the x-y mechanism. The bellow 544 generally surrounds the shaft 506, and more specifically may generally surround the upper shaft 518 and a portion of the lower shaft 520.

The x-y mechanism 504 generally surrounds the lower shaft 520. The x-y mechanism 504 further includes a second bellows 546 disposed therein, and surrounding the lower shaft 520. The second bellows 546 may be moveably coupled in an x-y plane (i.e., a plane parallel to the surface of a substrate) to one or more movement gauges 548. As depicted in cross-sectional view in FIG. 5, only one movement gauge 548 is shown. The movement gauge may, for example, be a metrological device such as a screw gauge, micrometer, caliper, or the like. The movement gauge may be coupled to an adjustment screw (not shown) which provides a force against the exterior of a base plate 545 coupled to the base of the second bellows 546, thereby translating the base of the second bellows 546 in the x-y plane. Thus, the translation of the second bellows 546 positions the support assembly 111 at a desired x-y position. Upon reaching the desired x-y position, the adjustment screw may be locked into position by a locking plate, or another similar mechanism known to one of skill in the art.

The x-y mechanism 504 may include at least one seal 550, for example, a lip seal, provided at the interface between x-y mechanism 504 and the outer surface of the lower shaft 520. The seal 550 may be formed below the base of the second bellows 546 as shown. The seal 550 is typically abrasion resistant and may be formed from polyethylene or other process compatible material. In some embodiments, the seals are formed from polytetrafluoroethylene (PTFE). In some embodiments (not shown), multiple seals 528 are disposed between x-y mechanism 504 and the outer surface of the lower shaft 520.

The x-y mechanism 504 may further include one or more bearings 552 for reducing friction, abrasion, or the like, between the x-y mechanism 504 and the outer surface of the lower shaft 520. As depicted in FIG. 5, the bearings 552 are disposed at the base of the x-y mechanism 504 and below the seal 550. However, the bearings 552 may be dispose at other positions along the x-y mechanism 504 that are in contact with the outer surface of the lower shaft 520. The bearings 520 may include stainless steel or ceramic ball bearings, or the like.

The rotation lift mechanism 500 may further include a cooling fan 554 coupled to the base 160 of the chamber 150, and disposed adjacent to the bellows 544.

Figure 10:
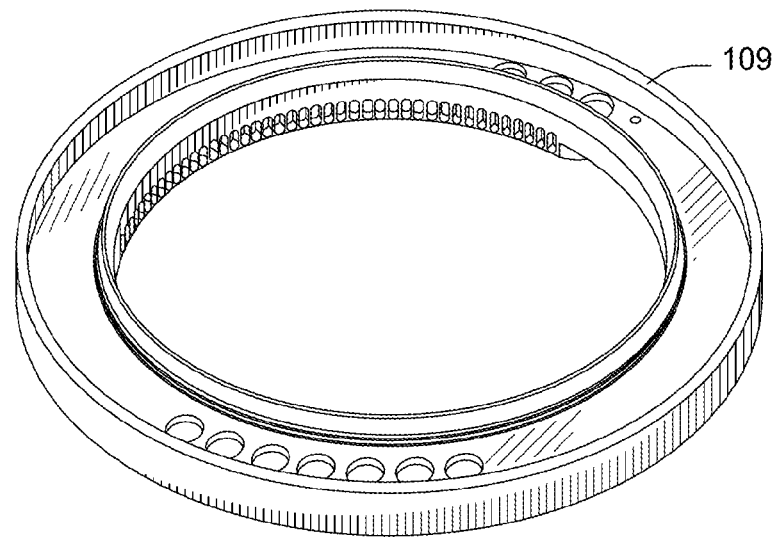
FIG. 10 depicts a perspective view of an exhaust pumping plate in accordance with some embodiments of the present invention.
Figure 11:
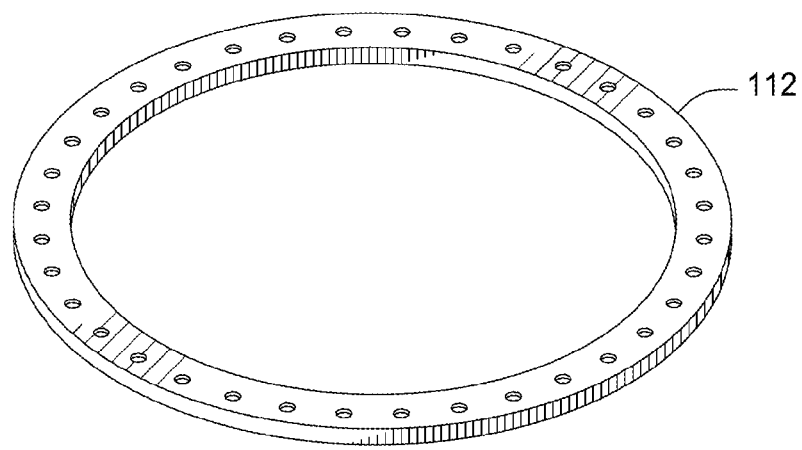
FIG. 11 depicts a perspective view of a cover for an exhaust pumping plate in accordance with some embodiments of the present invention.

Returning to FIG. 1, the pumping system 138 generally includes a throttle valve and one or more pumps arranged to control the pressure in the internal volume of the processing chamber 150. Gases flowing out of the processing chamber 150 are routed through a pumping ring to enhance gas flow uniformity across the surface of the substrate. For example, exhaust gases may exit the chamber through an exhaust pumping plate 109, a pumping port 126 formed in the wall 106 and coupled to the exhaust pumping plate 109, and ultimately, through the pumping system 138. The exhaust pumping plate 109 is configured to control the flow of exhaust from the processing region of the chamber. The exhaust pumping plate 109 may include a skirt extending downward and having a plurality of holes 107 formed therethrough in a section thereof. The section of the skirt of the exhaust pumping plate 109 having holes 107, shown as a series of slit-shaped holes, facilitates compensating for heat loss proximate the slit valve opening 114. In some embodiments, the exhaust pumping plate 109 may have an exhaust plate cover 112, which rests on top of the exhaust pumping plate 109. FIG. 10 depicts a three dimensional schematic view of the exhaust pumping plate 109 in accordance with some embodiments of the invention. FIG. 11 depicts a three dimensional schematic view of the exhaust plate cover 112 for the exhaust plate 109 in accordance with some embodiments of the invention. The cover 112 may be designed with optimized, nonuniform holes to provide a desired gas distribution (e.g., an even or purposely uneven gas distribution, as desired) to compensate for heat loss imbalance.

Returning to FIG. 1, the system controller 146 generally comprises a central processing unit (CPU) 151, a memory 143, and support circuits 152 and is coupled to and controls modules and apparatuses of the reactor 100. In operation, the controller 146 directly controls modules and apparatus of the system 100 or, alternatively, administers computers (and/or controllers) associated with these modules and apparatuses.

In some embodiments (not shown), the reactor 100 may comprise a photoexcitation system delivering radiant energy to a substrate disposed on the substrate support assembly 111 through windows (not shown) in the lid 110.

Thus, improved apparatus for depositing films on a substrate have been disclosed herein. The inventive apparatus may advantageously facilitate one or more of depositing films having reduced film thickness non-uniformity within a given process chamber, improved particle performance (e.g., reduced particles on films formed in the process chamber), chamber-to-chamber performance matching amongst a plurality of process chambers, and improved process chamber serviceability.

While the foregoing is directed to embodiments of the present invention, other and further embodiments of the invention may be devised without departing from the basic scope thereof.

The invention claimed is:

1. An apparatus for processing substrates, comprising:
a process chamber having a lower assembly and an upper assembly movably coupled to the lower assembly via a hinge, wherein the lower assembly includes a chamber body having a substrate support assembly disposed in the chamber body, and wherein the upper assembly includes a lid; and
a gas feedthrough coupled to the chamber body and the lid to facilitate flow of a gas from a gas panel to an interior of the process chamber, wherein the gas feedthrough comprises an upper body externally coupled to a periphery of the lid and a lower body externally coupled to a periphery of the chamber body such that the gas feedthrough does not pass through the chamber body or the lid, wherein the upper body includes one or more upper ports and the lower body includes a corresponding one or more lower ports, and wherein the one or more upper ports mate with the corresponding one or more lower ports when the lid is in a closed position.

2. The apparatus of claim 1, wherein at least one of the upper and lower bodies in each corresponding pair are adjustable to facilitate fine-tuning the coupling between the upper and lower bodies when the lid is in the closed position.

3. The apparatus of claim 1, further comprising:
an arm extending along an upper surface of the lid from the gas feedthrough to a lid manifold disposed above an inlet port in the lid; and
a single conduit disposed in the arm to facilitate flow of the gas from the one or more upper ports of the gas feedthrough to an opening of the lid manifold centrally disposed through the lid manifold and above the inlet port of the lid.

4. The apparatus of claim 3, wherein the single conduit terminates non-perpendicularly at the lid manifold such that gases entering the lid manifold tend to form a vortex.

5. The apparatus of claim 3, further comprising:
a mixer disposed between the one or more upper ports of the upper body of the gas feedthrough and the single conduit to mix gases prior to entering the single conduit.

6. The apparatus of claim 3, further comprising:
a remote plasma source having an outlet disposed above the opening in the lid manifold and contacting an upper surface of the lid manifold; and
a clamp disposed about the outlet of the remote plasma source and the lid manifold to provide a clamping force to a gasket disposed between the outlet of the remote plasma source and the upper surface of the lid manifold.

7. The apparatus of claim 6, further comprising:
one or more support brackets disposed about the outlet of the remote plasma source to secure the remote plasma source to the lid.

8. The apparatus of claim 3, further comprising:
a heater disposed in or on the arm to provide heat to gases flowing through the single conduit.

9. The apparatus of claim 8, further comprising:
a sensor to provide data corresponding to a temperature of gases flowing through the single conduit.

10. The apparatus of claim 8, wherein the arm is spaced apart from the upper surface of the lid.

11. The apparatus of claim 1, wherein the lid further comprises:

a faceplate extension circumscribing an inlet port of the lid and extending from a lower surface of the lid towards the substrate support assembly; and a faceplate coupled to the faceplate extension opposite the lower surface of the lid to define a mixing region between the lower surface of the lid, the faceplate extension, and the faceplate.

12. The apparatus of claim 11, wherein a surface of the faceplate opposing the lower surface of the lid comprises:

a non-anodized outer portion at an interface between the faceplate and the faceplate extension; and an anodized inner portion of the faceplate.

13. The apparatus of claim 1, wherein the upper assembly further comprises:

a lid support assembly to couple the lid to the chamber body, the lid support assembly comprising a pair of lower arms coupled to the chamber body and a pair of upper arms coupled to the lid, wherein the pair of lower arms and the pair of upper arms are coupled together to form a hinge.

14. The apparatus of claim 13, wherein the lid support assembly supports the lid such that the lid floats with respect to the hinge to facilitate better alignment of the lid with the chamber body.

15. The apparatus of claim 14, wherein the lid support assembly further comprises:

a pair of lid support plates, one lid support plate each disposed on each of the upper arms of the lid support assembly, to secure the lid to the lid support assembly; and a plurality of lid support pins coupled to and extending perpendicularly from each of the lid support plates, wherein the plurality of lid support pins extend through the lid and facilitate linear motion of the lid along the plurality of lid support pins.

16. The apparatus of claim 13, wherein the hinge is disposed on a side of the chamber body containing a slit valve opening to transfer a substrate into and out of the chamber body.

17. The apparatus of claim 1, wherein the substrate support assembly further comprises:

a substrate support; and a rotating lift assembly disposed beneath a base of the chamber body and coupled to the substrate support to raise, lower, and rotate the substrate support.

18. The apparatus of claim 17, wherein the rotating lift assembly is suspended beneath the base of the chamber body, and wherein the rotating lift assembly comprises:

a frame to support the substrate support via a shaft coupled to the substrate support within the chamber body via a shaft extending through a hole disposed through the base of the chamber body, wherein rotation of the shaft provides rotation to the substrate support; and a lift mechanism coupled to the frame off-axis from the shaft to move the frame and the substrate support assembly to raise and lower the substrate support assembly.

19. The apparatus of claim 18, wherein the rotating lift assembly further comprises:

a leveling plate coupling the frame to the base of the chamber body;

a ball and socket joint disposed proximate one end of the leveling plate to suspend the leveling plate from the base of the chamber body; and a level adjusting stud disposed on an opposing side of the leveling plate to level the leveling plate, and rotating lift assembly, with respect to the base of the chamber body.

20. The apparatus of claim 17, wherein the rotating lift assembly further comprises:

an x-y adjustment mechanism disposed beneath the base of the processing chamber to move the substrate support assembly in a plane parallel to a surface of a substrate disposed thereon.

* * * * *